Jan. 13, 1970 A. E. BJERKE 3,489,925

PULSE GENERATOR WITH VARIABLE PULSE WIDTH

Filed March 31, 1966 2 Sheets-Sheet 1

INVENTOR.
ARTHUR E. BJERKE
BY
Flehr and Swain
ATTORNEYS

PULSE GENERATOR WITH VARIABLE PULSE WIDTH

Filed March 31, 1966 2 Sheets-Sheet 2

INVENTOR.
ARTHUR E. BJERKE
BY
ATTORNEYS

United States Patent Office 3,489,925
Patented Jan. 13, 1970

3,489,925

PULSE GENERATOR WITH VARIABLE PULSE WIDTH

Arthur E. Bjerke, Walnut Creek, Calif., assignor to E-H Research Laboratories, Inc., Oakland, Calif., a corporation of California Filed Mar. 31, 1966, Ser. No. 539,178
Int. Cl. H03k 1/12
U.S. Cl. 307—265 10 Claims

ABSTRACT OF THE DISCLOSURE

A pulse generator for producing an output pulse having a variable pulse width. A timing pulse train is generated which sets the pulse repetition frequency. Relay means delay such pulse train a predetermined time to form a second pulse train of the same frequency having a predetermined phase difference with respect to the first pulse train. Adding means responsive to the leading edges of each of the pulse trains produces the output pulse train in which individual pulses have a width equal to phase difference between the two pulse trains.

The present invention is directed to a pulse generator for producing a pulse having a variable width.

Pulse generators for the higher frequency ranges are generally limited in frequency capability by the characteristics of the individual components of the pulse generating circuit. For example, the circuit elements contain a certain amount of capacitance and inductance and at high frequencies these may have very deleterious effects on the final output. In fact, given a cerain pulse width, these reactive effects may cause the pulse train to disappear or be severely attenuated for certain pulse repetition rates; in other words, the frequency response of the system is very uneven. If the generator is designed to serve multiple functions, such as generating a pulse with variable width, then the problems presented by capacitive and inductive effects is increased.

It is the general object of the present invention to provide an improved pulse generator.

It is another object of the invention to provide a pulse generator with improved high frequency operation.

It is yet another object of the invention to provide an improved pulse generator which has a variable pulse width but which has a flat response over a wide pulse repetition rate range.

It is still another object of the invention to provide an improved pulse generator which achieves satisfactory operation at higher frequency using components having normal frequency limitations.

In accordance with the above objects, there is provided a pulse generator including means for generating a first pulse train having a predetermined pulse repetition frequency. Delay means are coupled to this generator for producing a second pulse train having the same frequency as the first train and having a predetermined phase difference with respect to the first pulse train. Adding means are coupled to both the delay means and the generator means and are responsive to the two pulse trains for generating an output pulse train in which individual pulses have a width equal to the above phase difference.

Other objects and features of the invention will become apparent from the accompfanying drawings and the following description.

Referring to the drawings.

Figures 1, 3:
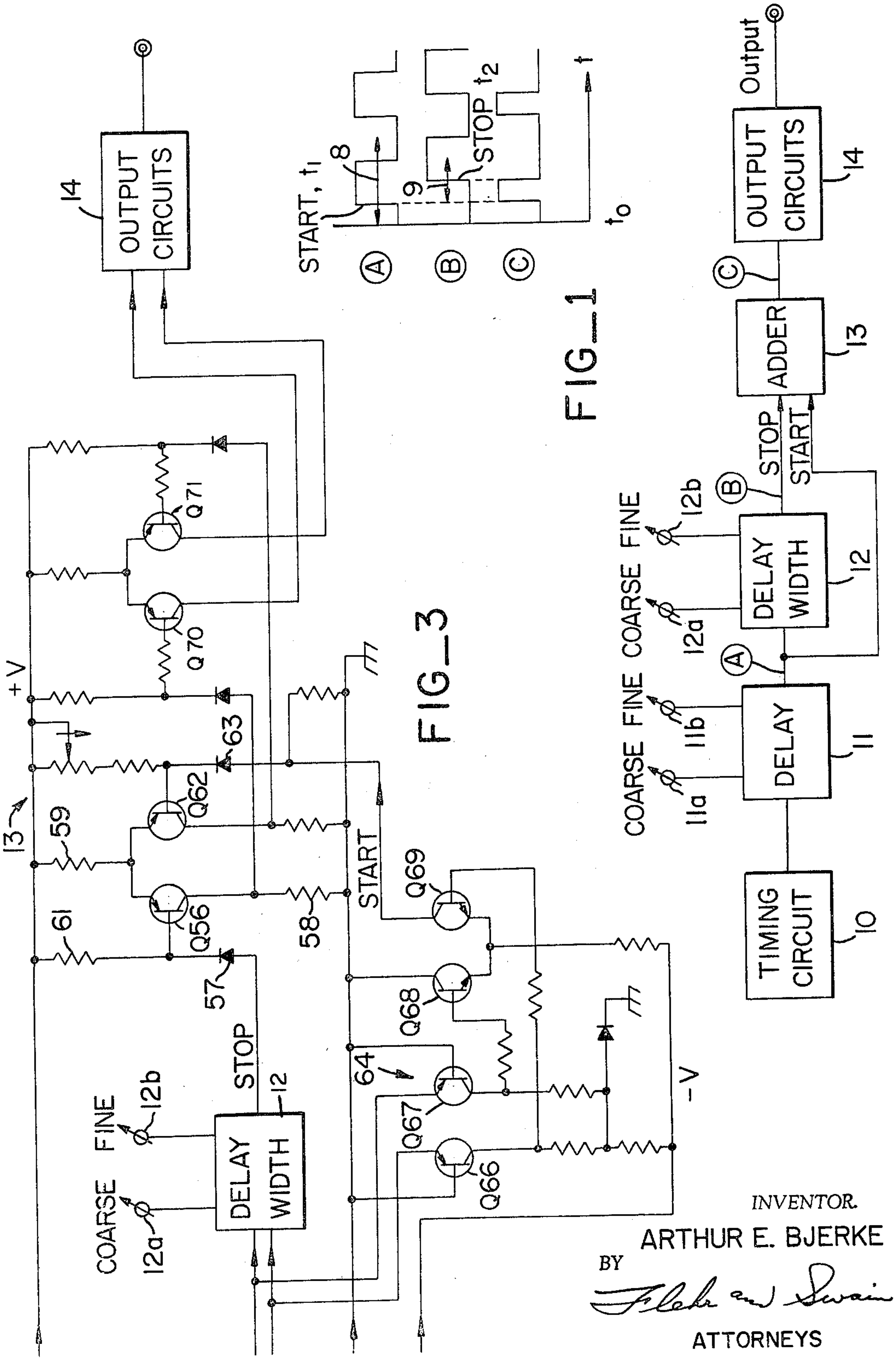
FIGURE 1 is a block diagram of a circuit embodying the novel pulse generator of the present invention.
FIGURES 2 and 3 are schematic circuit diagrams of portions of FIGURE 1.

The pulse generator of the present invention as disclosed in FIGURE 1 includes a timing circuit 10 which produces a pulse train having a certain pulse repetition rate. The initiation of a pulse train is usually controlled by auxiliary trigger means (not shown). Delay means 11 coupled to timing circuit 10 delays the pulse train. Such delay is illustrated by waveform A showing the pulse output of delay means 11 which starts at time $t_1$ as compared to the earlier trigger time $t_0$. The magnitude of the delay is adjusted by coarse and fine controls 11*a* and 11*b* and is indicated by the arrows 8. As illustrated, the delay is always less than the pulse period. In effect, delay means 11 controls the time of initiation of the final output pulse.

Coupled to delay means 11 is a delay width means 12 which is similar in construction to delay means 11, including coarse and fine controls 12*a* and 12*b*, which delays, the pulse from delay means 11 by a time increment, $t_2$–$t_1$, as shown by waveform B which illustrates the output of delay width means 12. The variability of the delay is indicated by arrows 9.

An adder circuit 13 is coupled to both delay width device 12 and delay means 11 and is responsive to the individual pulses generated by these means to produce an output pulse shown as waveform C which has a pulse width equal to time $t_2$–$t_1$; in other words, equal to the time delay set into delay width means 12.

The generation of the leading edge of pulse train C by adder 13 is initiated at time, $t_1$, by the leading edge of pulse train A from delay means 11. This input to the adder is labeled "START." The leading edge of waveform B, at time, $t_2$, stops the generation of the output pulse to produce final waveform C. An output circuit amplifies waveform C and has an output terminal which may be coupled to a utilization device. In summary, the start of the output pulse is determined by delay means 11 and the pulse width by delay 12.

Figure 2:
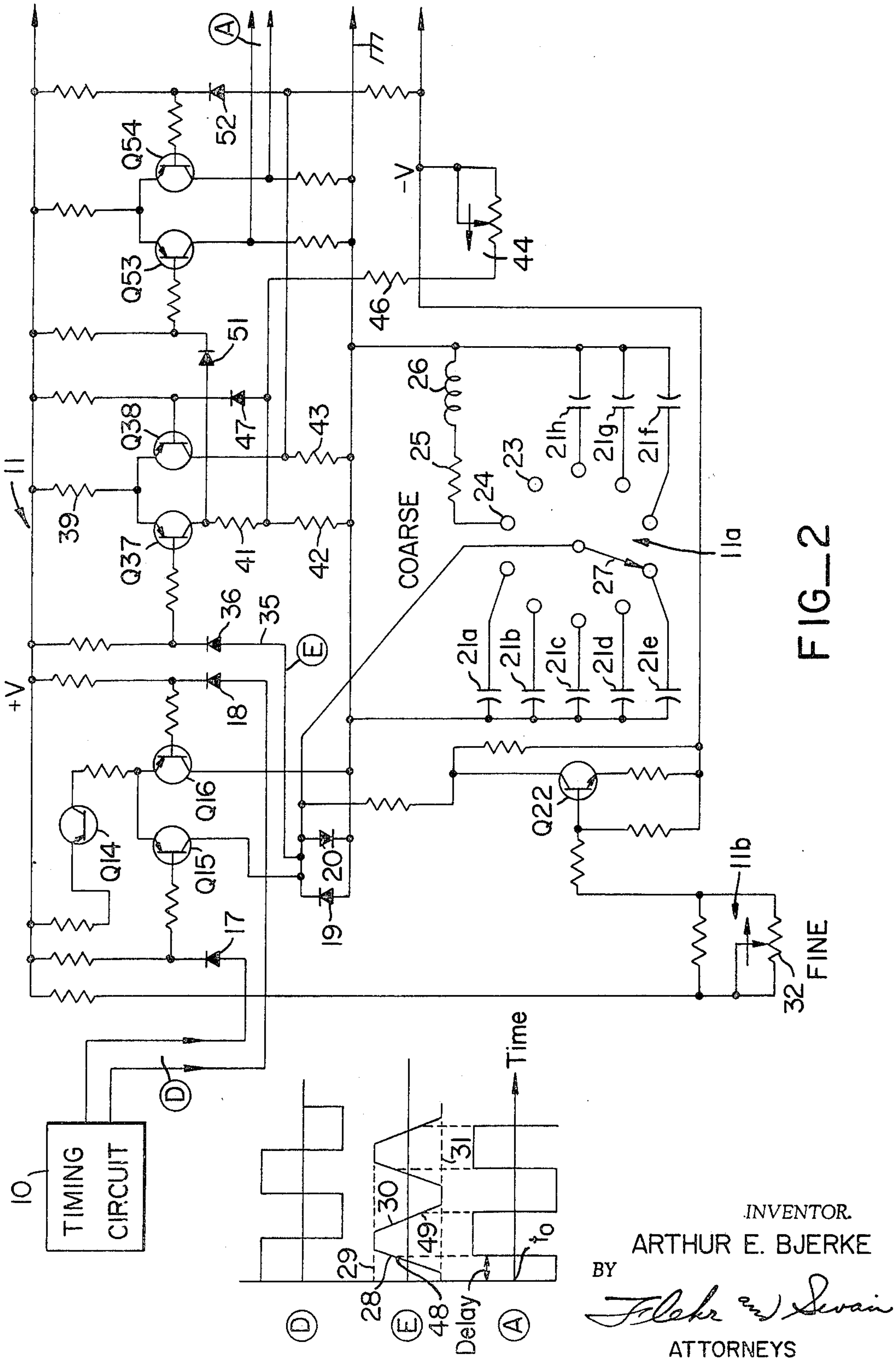

FIGURE 2 shows a portion of the time delay circuit 11 in greater detail. A multivibrator output pulse train D from timing circuit 11 is coupled to the bases of the transistors Q15 and Q16. The pulse output from the timing circuit is complementary in order to provide for a constant current drain on the power supply, reducing extraneous interference frequencies. Pulse train D is simplified to show only one-half of this set of complementary pulses.

As mentioned above, the function of delay circuit 11 is to establish the time of initiation of the output pulse. From a broad standpoint, the delay circuit operates by charging and discharging a capacitor with a constant current, forming a triangular or trapezoidal waveshape shown as waveshape E and using this waveshape as a trigger voltage for a Schmitt trigger squaring circuit to produce the output waveform A which is the output of delay circuit 11. More specifically, the bases of transistors Q15 and Q16 are coupled to timing circuit 10 by Zener diodes 17 and 18 and operate as a current mode switch circuit. Transistor Q15 is clamped to a certain voltage above and below ground by diodes 19 and 20 which are coupled to chassis ground. Diode 19 has its cathode coupled to the collector of transistor Q15 and its anode to ground, and diode 20 its cathode coupled to the ground and its anode to the collector of transistor Q15. The collector of transistor Q16 is coupled to the ground.

Coarse delay control 11*a* constitutes a selector switch which has ten positions and is capable of selecting ten different time delays. Associated with eight of the positions are capacitors 21*a* through 21*h* which provide for a variable time delay in a manner to be described below. In one position 23, only the stray capacitance of the circuit is used and in a final position 24, a series connected resistance 25 and inductor 26 serve in effect as a negative capacitance, concelling stray capacitance, to provide a minimum time delay. All of the capacitors and inductor 26 are coupled between the ground and a moving switch arm 27 which is coupled to the collector of 315 and diodes 19 and 20.

The complementary square wave output from timing circuit 10, as represented by curve D, alternately switches 315 and 316 on and off. When Q15 is on, current from a transistor Q14 which is coupled between a positive voltage source, +V, and the tied emitters of transistors Q15 and Q16, flows through Q15 into a selected delay capacitor, 21*a–h*, or into positions 23 and 24. The selected capacitor charges, forming a ramp function, until its voltage equals the forward voltage drop of diode 20 at which point it is clamped. Curve E illustrates the charging ramp voltage 28 and the upper clamping voltage level 29 is shown by dashed line. When the input voltage pulse train D drops to its opposite value, Q15 turns off and Q16 turns on, and the collector current of Q14 now flows through Q16 to ground. The selected capacitor begins to discharge and the discharge current is controlled by a transistor Q22 which is emitter coupled to a negative voltage source, —V. The collector of transistor Q22 is coupled to switch arm 27 and supplies one-half the amount of current as compared to the charging current of Q14. Thus, the decay or fall curve 30, as illustrated by curve E, is substantially similar to the rise curve. Again this discharge occurs until the capacitor is clamped at level 31 by the diode 19. Fine control 11*b* provides a vernier delay and includes a potentiometer 32 which is coupled to the bases of transistors Q14 and Q22 and to the positive voltage source. The potentiometer controls the base bias of the transistors, and, therefore, the charge and discharge currents available to the delay capacitors 21. Thus, the output of the curent mode switch, Q15, Q16, on line 35 is a trapezoidal type of pulse illustrated by pulse train E. However, depending on the amount of delay, the waveform E may not reach the clamping level and thus will be a triangular pulse; in other cases, it may be an extremely trapezoidal pulse.

The output of switch Q15, Q16 is coupled by a Zener diode 36 to the base of a transistor Q37 which comprises one of a pair of transistors which form a Schmitt trigger circuit, the other transistor being Q38. A Schmitt trigger circuit is essentially a conventional bistable multivibrator and serves as a squaring circuit, but is different in that a common emitter resistor 39 is provided for faster switching time. Transistor 37 has its collector coupled to ground through resistors 41 and 42, and Q38 has its collector coupled to ground through a resistor 43. The firing level of the trigger circuit is controlled by a potentiometer 44 which is coupled between —V and through a resistor 46 to the collector of transistor Q37 through resistor 41. It is also coupled to the base of transistor Q38 through a Zener type diode 47. The Schmitt trigger fires approximately when the voltage waveform applied to its input on the base of transistor Q37 passes through ground level on the upward slope, and again fires as the input voltage reverses and passes through the ground level. This is illustrated by curves E and A where the firing points 48 and 49 are indicated which cause production of the square wave A. It can easily be seen that by variation of the slopes of the waveform E, as has been discussed previously, that, with a contant firing level of the Schmitt trigger, the delay of curve A with respect to curve D may be varied. Schmitt trigger, Q33, Q38, is Zener diode coupled by means of diodes 51 and 52 to an amplifier including transistors Q53 and Q54 which then amplify the square wave, A, and couple it to the delay width means 12.

In the delay width device 12, the pulse train is again delayed, as discussed above, the resultant phase difference being related to the final width of the output pulse. Operation and construction of the delay width circuits 12 is substantially similar to the delay circuits 11.

Adding circuit 13 includes a transistor Q56 which has its base coupled to the output of delay width device 12 through a Zener diode 57 and has its collector coupled to ground through a resistor 58, the emitter is coupled to a +V through a resistor 59. The base is coupled to —V through a resistor 61.

A transistor Q62 which has a common emitter circuit with Q56 is similarly coupled between +V and ground and has, as a base input through a Zener diode 63, a start pulse from amplifier circuits 64 which in turn are coupled to the input of delay width device 12. Amplifier circuits 64 comprise transistors Q66–Q69 which amplify the complementary start pulses, A, by means of common base amplifiers Q66 and Q67, which have a relatively low input impedance. Q66 and Q67 drive the switching circuit Q68, 69 which squares up the pulse and provides the start pulse output from the collector of Q69 connected to the base of transistor 62. Transistors Q56 and Q62 form a current mode switch circuit responsive to the stop and start pulses to produce a pair of complementary pulses which have a pulse width equal to the delay time produced by delay device 12. The complementary outputs of Q56 and Q62 are coupled to an amplifier including transistors Q70 and Q71 which are coupled to output circuit 14.

The adding circuit, in operation, receives a start pulse from delay width device 12 on the base of transistor Q62. Before the start pulse arrives, during the quiescent condition, Q62 is off and Q56 is on. The start pulse arrives at time $t_1$, as discussed in conjunction with FIGURE 1, which turns Q62 on, and, at the same time, turns Q56 off. At time $t_2$, the stop pulse arrives which, again, switches the circuit turning Q56 on and Q62 off, returning it to its original condition. Accordingly, an output pulse is produced on the collectors of Q56 and Q62. When the start pulse terminates at a later time, and, in addition, when the stop pulse terminates, these have no effect on the condition of transistors Q56 and Q62.

The waveforms illustrated in conjunction with the invention are, with the exception of the output pulse train C, of a configuration which does not permanently charge any stray or miscellaneous capacitance in the over-all circuit. This prevents deleterious effects which would ordinarily be caused by a slight drifting of the circuit from its normal voltage level. More specifically, the waveforms shown are of either a square or trapezoidal waveshape, where the plus and negative portions of the wave are of equal time duration and the integrated area under them is also equal. To express this concept in more general terms, the pulse train has a zero full cycle average with reference to a certain time axis, and this time axis is so positioned that the negative and positive portions of the pulse train have equal time lengths. This concept is clear from the inspection of waveforms A, B, D and E. In other words, any charging which is done by these intermediate waveforms of stray capacitance is always accompanied by a similar amount of discharging action. It is an important result of this invention that the novel means of achieving variable pulse width is accomplished with the use of these symmetrical types of waveforms.

I claim:

1. In a pulse generator, means for generating a first pulse train of a predetermined pulse repetition frequency, delay means coupled to said generator means for producing a second pulse train of said frequency having a predetermined phase difference with respect to said first pulse train, said delay means including squaring circuit means coupled to variable storage circuit means which means are responsive to said first pulse train to generate a ramp voltage having a predetermined slope, said squaring circuit means being responsive to the magnitude of said slope to generate said second pulse train having a phase difference with respect to said first pulse train determined by said slope magnitude, and adding means coupled to said delay means and said generating means and responsive to said two pulse trains for generating an output pulse train in which individual pulses have a width equal to said phase difference.

2. In a pulse generator as in claim 1 in which additional delay means are provided for adjusting the phase of said first pulse train with respect to a predetermined reference time.

3. In a pulse generator as in claim 1 in which said delay means is adjustable over a predetermined range of phase differences.

4. In a pulse generator as in claim 1 in which said first pulse train has a zero full cycle average with reference to a time axis on which portions of the pulse train above and below the axis have equal time lengths.

5. In a pulse generator as in claim 4 in which said second pulse train has a zero full cycle average with reference to a time axis on which portions of the pulse train above and below the axis have equal time lengths.

6. In a pulse generator as in claim 1 in which said storage means include a plurality of capacitors and at least one inductor, each corresponding to a predetermined slope and phase difference.

7. In a pulse generator as in claim 6 in which said inductor provides a minimum phase difference relative to said capacitors.

8. In a pulse generator as in claim 6 in which said capacitors and inductor are shunt connected to said squaring circuit means.

9. In a pulse generator as in claim 6 in which said delay means is direct coupled to said adding means whereby charge storage time is minimized.

10. In a pulse generator as in claim 1 in which said first pulse train serves as start pulses and said second pulse train serves as stop pulses and in which said adding means includes switching means responsive only to the leading edge of a start pulse to initiate an output pulse and responsive only to the leading edge of a stop pulse to terminate said output pulse whereby the phase difference between said leading edges of said start and stop pulses determines the width of said output pulse.

References Cited

UNITED STATES PATENTS 2,226,459 12/1940 Bingley ............. 328—28

DONALD D. FORRER, Primary Examiner

B. P. DAVIS, Assistant Examiner

U.S. Cl. X.R.

307—260; 328—58, 108